(12) United States Patent
Inoue et al.

(10) Patent No.: US 9,356,110 B2
(45) Date of Patent: May 31, 2016

(54) SEMICONDUCTOR DEVICE AND MANUFACTURING METHOD THEREOF

(71) Applicant: Renesas Electronics Corporation, Kanagawa (JP)

(72) Inventors: Masao Inoue, Kanagawa (JP); Yoshiki Maruyama, Kanagawa (JP); Akio Nishida, Kanagawa (JP); Yorinobu Kunimune, Kanagawa (JP); Kota Funayama, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 10 days.

(21) Appl. No.: 14/173,074

(22) Filed: Feb. 5, 2014

(65) Prior Publication Data

US 2014/0312406 A1 Oct. 23, 2014

(30) Foreign Application Priority Data

Feb. 26, 2013 (JP) ................................. 2013-036047

(51) Int. Cl.
| | |
|---|---|
| *H01L 21/28* | (2006.01) |
| *H01L 29/40* | (2006.01) |
| *H01L 29/49* | (2006.01) |
| *H01L 29/423* | (2006.01) |
| *H01L 21/02* | (2006.01) |
| *H01L 29/66* | (2006.01) |

(52) U.S. Cl.
CPC ........ *H01L 29/4925* (2013.01); *H01L 21/0245* (2013.01); *H01L 21/02488* (2013.01); *H01L 21/02502* (2013.01); *H01L 21/02532* (2013.01); *H01L 21/02667* (2013.01); *H01L 21/28035* (2013.01); *H01L 21/28176* (2013.01); *H01L 21/28273* (2013.01); *H01L 29/42324* (2013.01); *H01L 29/4916* (2013.01); *H01L 29/66825* (2013.01)

(58) Field of Classification Search
CPC ................... H01L 21/28035; H01L 21/28273; H01L 21/02532; H01L 21/28176; H01L 21/32055; H01L 21/3211; H01L 29/4925; H01L 29/4916
USPC ......................... 438/488, 489, 588, 660, 663
See application file for complete search history.

(56) References Cited

U.S. PATENT DOCUMENTS

| | | | | |
|---|---|---|---|---|
| 4,897,360 | A | * | 1/1990 | Guckel ................. G01L 9/0042 148/DIG. 122 |
| 5,567,639 | A | * | 10/1996 | Chang ............... H01L 27/10817 257/E21.016 |
| 5,614,428 | A | * | 3/1997 | Kapoor ................. H01L 21/266 257/E21.197 |

(Continued)

FOREIGN PATENT DOCUMENTS

| | | |
|---|---|---|
| JP | 2001-210593 | 8/2001 |
| JP | 2006-120734 | 5/2006 |

*Primary Examiner* — Marvin Payen
*Assistant Examiner* — Jeremy Joy
(74) *Attorney, Agent, or Firm* — Young & Thompson

(57) ABSTRACT

To control a grain growth on laminated polysilicon films, a method of manufacturing a semiconductor device is provided. The method includes: forming a first polysilicon film (21) on a substrate (10); forming an interlayer oxide layer (22) on a surface of the first polysilicon film (21); forming a second polysilicon film (23) in contact with the interlayer oxide layer (22) above the first polysilicon film (21); and performing annealing at a temperature higher than a film formation temperature of the first and second polysilicon films in a gas atmosphere containing nitrogen, after formation of the second polysilicon film (23).

18 Claims, 9 Drawing Sheets

(56) References Cited

U.S. PATENT DOCUMENTS

| | | | |
|---|---|---|---|
| 6,413,841 B1* | 7/2002 | Tsuboi | H01L 21/28035 257/51 |
| 6,482,709 B1* | 11/2002 | Lai | H01L 21/26506 257/E21.197 |
| 2002/0048917 A1* | 4/2002 | Sekine et al. | 438/585 |
| 2002/0195643 A1* | 12/2002 | Harada | H01L 21/28176 257/310 |
| 2007/0080393 A1* | 4/2007 | Togo | H01L 21/26506 257/315 |
| 2008/0185635 A1* | 8/2008 | Yanagi | G11C 16/0466 257/325 |
| 2013/0075824 A1* | 3/2013 | Fukushima | H01L 21/28035 257/368 |

* cited by examiner

SEMICONDUCTOR DEVICE AND MANUFACTURING METHOD THEREOF

CROSS-REFERENCE TO RELATED APPLICATIONS

This application is based upon and claims the benefit of priority from Japanese patent application No. 2013-036047, filed on Feb. 26, 2013, the disclosure of which is incorporated herein in its entirety by reference.

BACKGROUND

The present invention relates to a semiconductor device and a manufacturing method thereof.

At present, MOS (Metal Oxide Semiconductor) transistors for logic circuits used for LSI (Large Scale Integration) products in general at a technology node of 28 nm to 22 nm are mass-produced as advanced devices. At a technology node of 100 nm or less, the line width of becomes equal to the grain size of a polysilicon electrode used as a gate electrode. The adverse effects on microprocessing techniques, such as deterioration in the lithography precision due to the plane roughness caused by a grain, and a line edge roughness obtained after dry etching, are no longer negligible.

Japanese Unexamined Patent Application Publication Nos. 2006-120734 and 2001-210593 disclose a method of manufacturing a semiconductor device including polysilicon films. Japanese Unexamined Patent Application Publication Nos. 2006-120734 and 2001-210593 disclose a method for forming polysilicon films in a plurality of installments. According to the manufacturing method disclosed in Japanese Unexamined Patent Application Publication No. 2006-120734, a gas containing oxygen is supplied during the period between the step of forming a first polysilicon film and the step of forming a second polysilicon film. By bringing oxygen into contact with the first polysilicon film, the crystal growth of the polysilicon film is stopped. As the gas containing oxygen, an $O_2$ gas, an $NO_2$ gas, or an NO gas is used.

SUMMARY

The present inventors have found the following problem. It is known that an annealing step performed after the formation of polysilicon films promotes further grain growth. Accordingly, there is a demand for a method of forming a polysilicon film which has a small grain size at the stage of film formation and in which the grain growth is suppressed due to annealing in the subsequent step, or a demand for an annealing method in which the grain growth is suppressed. The manufacturing methods disclosed in Japanese Unexamined Patent Application Publication Nos. 2006-120734 and 2001-210593 are not sufficient to suppress the grain growth.

Other problems and novel features will become obvious from the following description and the accompanying drawings of the present application.

According to a first aspect of the invention, annealing is performed in a gas atmosphere containing nitrogen, after formation of a second polysilicon film.

According to the first aspect of the invention, the grain growth of the polysilicon film can be suppressed.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
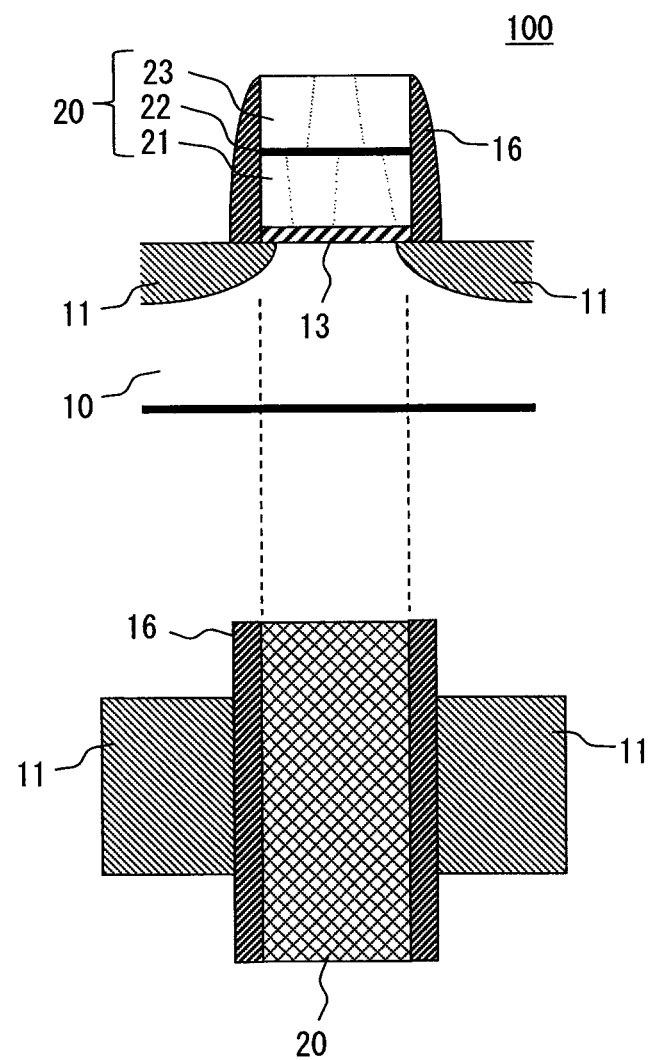
FIG. 1 is a schematic diagram showing a configuration of a semiconductor device according to an embodiment of the present invention.

For ease of explanation, the following description and the drawings are abbreviated and simplified as appropriate. In the accompanying drawings, the same elements are denoted by the same reference numerals, and a repeated explanation thereof is omitted as needed.

First Embodiment

FIG. 1 is a schematic diagram of a semiconductor device according to a first embodiment. A sectional view of the semiconductor device is shown at the upper side of FIG. 1, and a plan view of the semiconductor device is shown at the lower side of FIG. 1. The semiconductor device according to the first embodiment includes a transistor 100 in which a gate electrode is formed of laminated polysilicon films. The following description is made assuming that the semiconductor device is the NMOS or PMOS transistor 100. However, the semiconductor device is not limited to MOS transistors. The semiconductor device may have any configuration as long as the semiconductor device includes a plurality of polysilicon films.

The transistor 100 includes a substrate 10, a gate 20, source/drain diffusion layers 11, and a gate insulating film 13.

The substrate 10 is, for example, a silicon substrate. The source/drain diffusion layers 11 are formed in the substrate 10. The source/drain diffusion layers 11 are formed by, for example, diffusing an impurity (dopant), such as B (boron) or P (phosphorus), into the substrate 10. The gate insulating film 13 is formed on the substrate 10. The gate 20 is disposed on the gate insulating film 13. Side wall insulating films 16 are disposed on side surfaces of the gate insulating film 13 and the gate 20. In other words, the side wall insulating films 16 cover the side surfaces of the gate 20. Though not shown in FIG. 1, isolation oxide films are formed outside the source/drain diffusion layers 11.

The gate 20 includes a plurality of polysilicon films. Specifically, a first polysilicon film 21 is disposed on the gate insulating film 13. An interlayer oxide layer 22 is disposed on the first polysilicon film 21. A second polysilicon film 23 is disposed on the interlayer oxide layer 22. That is, the interlayer oxide layer 22 is interposed between the first polysilicon film 21 and the second polysilicon film 23. The upper surface of the interlayer oxide layer 22 is in contact with the second polysilicon film 23. The interlayer oxide layer 22 is a silicon oxide film containing nitrogen. Though FIG. 1 shows the two polysilicon films, i.e., the first polysilicon film 21 and the second polysilicon film 23, three or more polysilicon films may be formed. In this case, it is desirable to form the interlayer oxide layer 22 between the respective polysilicon films. In other words, it is preferable to form two or more interlayer oxide layers 22.

Figure 2:
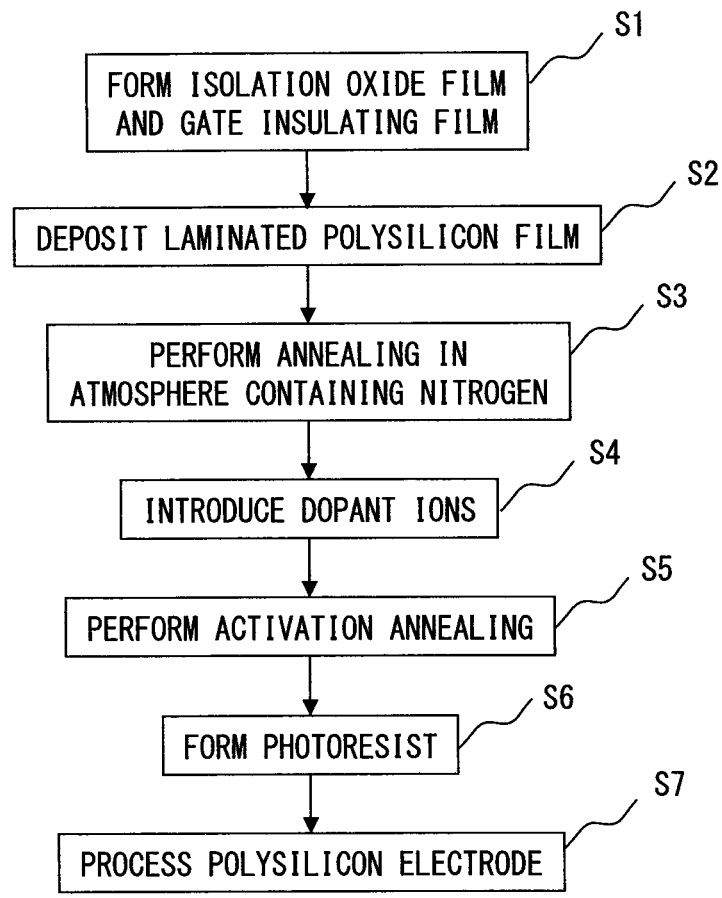
FIG. 2 is a flowchart showing a manufacturing method according to an embodiment of the present invention.

Next, a manufacturing method of the semiconductor device will be described with reference to FIGS. 2 and 3A to 3G. FIG. 2 is a flowchart showing the manufacturing method of the semiconductor device. FIGS. 3A to 3G are process sectional views showing manufacturing processes for the semiconductor device.

Figure 3A:
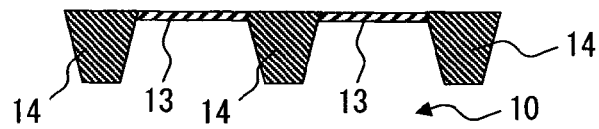
FIG. 3A is a manufacturing process sectional view showing the manufacturing method according to an embodiment of the present invention.

Referring first to FIG. 3A, each isolation oxide film 14 is formed by a technique, such as STI (Shallow Trench Isolation), in the substrate 10, and the gate insulating film 13 is then formed in each active region of the substrate 10 (step S1). The gate insulating film 13 is, for example, a silicon oxide film. In step S1, nitrogen may be introduced into the gate insulating film 13 by a plasma nitriding process.

Figure 3B:
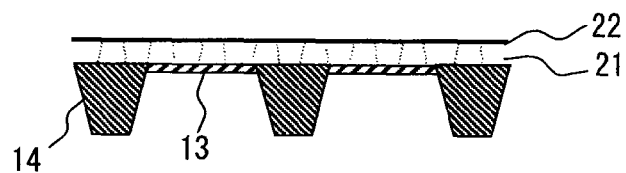
FIG. 3B is a manufacturing process sectional view showing the manufacturing method according to an embodiment of the present invention.

Next, laminated polysilicon films are deposited on the gate insulating film 13 and the isolation oxide film (the isolation region) 14 (step S2). Accordingly, the first polysilicon film 21 is first deposited so as to cover the gate insulating film 13 and the isolation oxide film 14. After that, the surface of the first polysilicon film 21 is oxidized. As a result, the thin interlayer oxide layer 22 is formed on the surface of the first polysilicon film 21 as shown in FIG. 3B. The method for forming the first polysilicon film 21 and the interlayer oxide layer 22 is not particularly limited. For example, the method disclosed in Japanese Unexamined Patent Application Publication No. 2006-120734 or the method disclosed in Japanese Unexamined Patent Application Publication No. 2001-210593 can be used. Specifically, the first polysilicon film 21 can be formed by low pressure CVD (Chemical Vapor Deposition). By exposing the surface of the first polysilicon film 21 to a gas containing oxygen, the interlayer oxide layer 22 can be formed on the surface of the first polysilicon film 21.

Figure 3C:
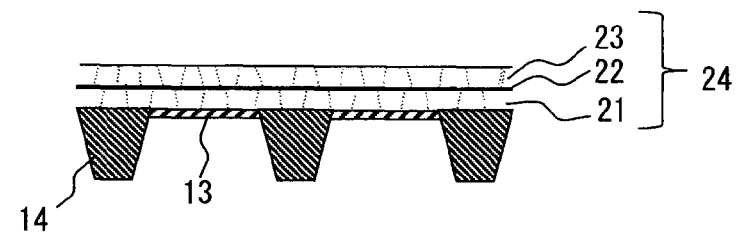
FIG. 3C is a manufacturing process sectional view showing the manufacturing method according to an embodiment of the present invention.

After formation of the interlayer oxide layer 22 on the surface of the first polysilicon film 21, the second polysilicon film 23 is deposited on the interlayer oxide layer 22. This allows the second polysilicon film 23 to cover the interlayer oxide layer 22 as shown in FIG. 3C. The second polysilicon film 23 is formed by low pressure CVD in the same manner as the first polysilicon film 21. A laminated polysilicon film 24 is formed on the gate insulating film 13. Assuming that the thickness of the laminated polysilicon film 24 is 100 nm, the thickness of the first polysilicon film 21 and that of the second polysilicon film 23 are each preferably 50 nm. Note that the thickness distribution of the films may be adjusted depending on the gate processing conditions and the like. The second polysilicon film 23 is formed by a method similar to that for the first polysilicon film 21. While the interlayer oxide layer 22 is in the thickness range of a submonolayer in the technique disclosed in Japanese Unexamined Patent Application Publication No. 2006-120734, the interlayer oxide layer 22 may be in the thickness range of several layers.

Figure 3D:
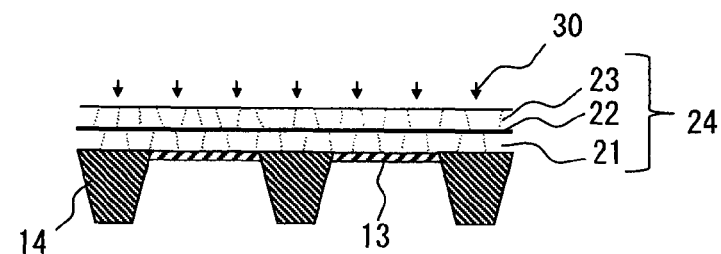
FIG. 3D is a manufacturing process sectional view showing the manufacturing method according to an embodiment of the present invention.

Next, annealing is performed in an atmosphere containing nitrogen (step S3). As a result, molecules 30 of the gas containing nitrogen are introduced into the second polysilicon film 23 from the surface of the second polysilicon film 23 as shown in FIG. 3D. In this case, annealing is performed at a high temperature of about 1000° C. in a nitrogen oxide gas atmosphere, such as an NO gas or an $N_2O$ gas. This allows the nitrogen oxide gas to be diffused into the grain boundary of the second polysilicon film 23, which is formed in the upper layer, and to pile up on the interlayer oxide layer 22. Note that a nitrogen gas may be used instead of the nitrogen oxide gas. Alternatively, a mixed gas of a nitrogen oxide gas and a nitrogen gas may be used. Another alternative is that a mixed gas of a nitrogen oxide gas or a nitrogen gas and another gas may be used.

In step S3, annealing is performed immediately after the formation of the second polysilicon film 23. Accordingly, prior to the growth of the grain of the laminated polysilicon film 24, nitrogen can be introduced into the laminated polysilicon film 24. In step S3, annealing may be performed at a temperature higher than the film formation temperature of the first polysilicon film 21 and the second polysilicon film 23 in step S2. Further, in step S3, the annealing may be carried out at a temperature higher than the film formation temperature of the interlayer oxide layer 22 in step S2. For example, the annealing temperature in step S3 is preferably 900° C. or higher, and more preferably, 1000° C. or higher. This allows NO to pass through the second polysilicon film 23 and to be introduced into the interlayer oxide layer 22. In addition, the pressure during annealing is preferably a normal pressure. The pressure during annealing may be an atmospheric pressure or higher, i.e., 760 Torr ($1.0 \times 10^5$ Pa) or higher.

Figure 3E:
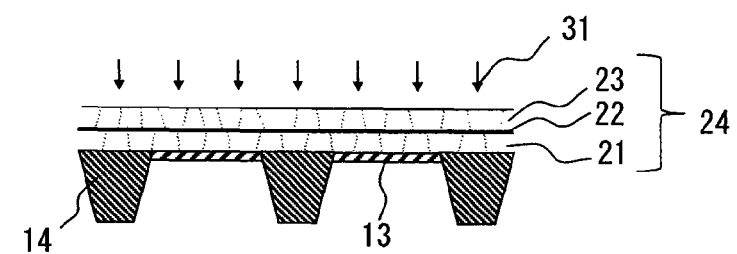
FIG. 3E is a manufacturing process sectional view showing the manufacturing method according to an embodiment of the present invention.

Next, to reduce the resistance of the laminated polysilicon film 24, a dopant is introduced into the laminated polysilicon film 24 (step S4). For example, as shown in FIG. 3E, a dopant 31, such as P or B, is implanted from above the second polysilicon film 23 by using an ion implantation technique or the like. At this time, if the dopant 31 permeates the gate insulating film 13, the gate insulating film 13 is damaged, resulting in deterioration of the reliability thereof. To prevent deterioration of the reliability of the gate insulating film 13, the implantation energy for ion implantation is set at a low level, and the dopant is distributed in a shallow portion near the surface of the laminated polysilicon film 24. In advanced logic devices, an N-type dopant (such as phosphorus or arsenic) and a P-type dopant (such as boron or indium) may be separately ion-implanted with a resist mask so as to fabricate a COMS.

After the introduction of the dopant 31, activation annealing for activating the dopant is performed (step S5). In this case, to activate the dopant 31 which is introduced into the second polysilicon film 23, the substrate 10 is annealed at an appropriate temperature of about 700° C. to 1000° C. At this time, grain regrowth occurs even in laminated polysilicon films having a small grain size. In the activation annealing of step S5, it is preferable to perform annealing at a temperature lower than that for annealing in step S3. The annealing temperature in step S3 is preferably the highest temperature among the annealing temperatures after the formation of the second polysilicon film 23. However, even when the annealing temperature in step S5 is higher than the annealing temperature in step S3, the grain growth can be controlled by the effect of nitrogen introduced into the interlayer oxide layer 22.

Figure 3F:
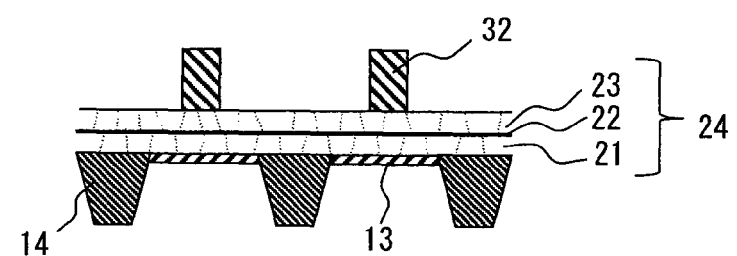
FIG. 3F is a manufacturing process sectional view showing the manufacturing method according to an embodiment of the present invention.
Figure 3G:
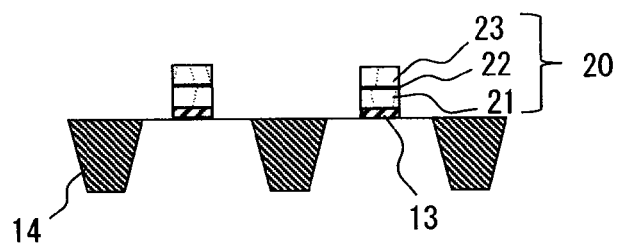
FIG. 3G is a manufacturing process sectional view showing the manufacturing method according to an embodiment of the present invention.

Next, a photoresist is formed for patterning of the gate 20. The photoresist is coated, exposed to light, and developed by a typical photolithography process. As a result, as shown in FIG. 3F, a pattern of a resist 32 is formed on the second polysilicon film 23. In this case, the resist 32 is patterned so that the pattern of the resist 32 remains in each region in which the gate is formed. As described in Japanese Unexamined Patent Application Publication No. 2001-210593, the roughness of the polysilicon surface reflects the grain size. Accordingly, if grain regrowth occurs, the surface roughness increases, which results in degradation of the lithography precision.

After the formation of the resist 32, a polysilicon electrode is processed (step S7). In this case, the second polysilicon film 23, the interlayer oxide layer 22, the first polysilicon film 21, the gate insulating film 13, and the like are etched with the resist 32 as a mask. For example, a dry etching technique can be used. After etching, the resist 32 formed on the second polysilicon film 23 is removed, thereby obtaining the configuration shown in FIG. 3G. In a portion exposed from the resist 32, the second polysilicon film 23, the interlayer oxide layer 22, and the first polysilicon film 21 are etched, with the result that the gate 20 is formed. The gate 20 is a laminated polysilicon electrode.

The degradation of the lithography precision causes variations in the gate length. There is another problem that as the grain size increases, irregularities (line edge roughness) on the gate side surfaces increase. Such macroscopic and microscopic variations in the channel length cause variations in threshold voltage of the MOS transistor, which has a significant adverse effect on the performance and production yield of an LSI device. After step S7, extension implantation, spacer formation, and deep source/drain implantation are carried out. In this manner, the transistor 100 including the gate 20 formed of laminated polysilicon films is completed.

Figure 4:
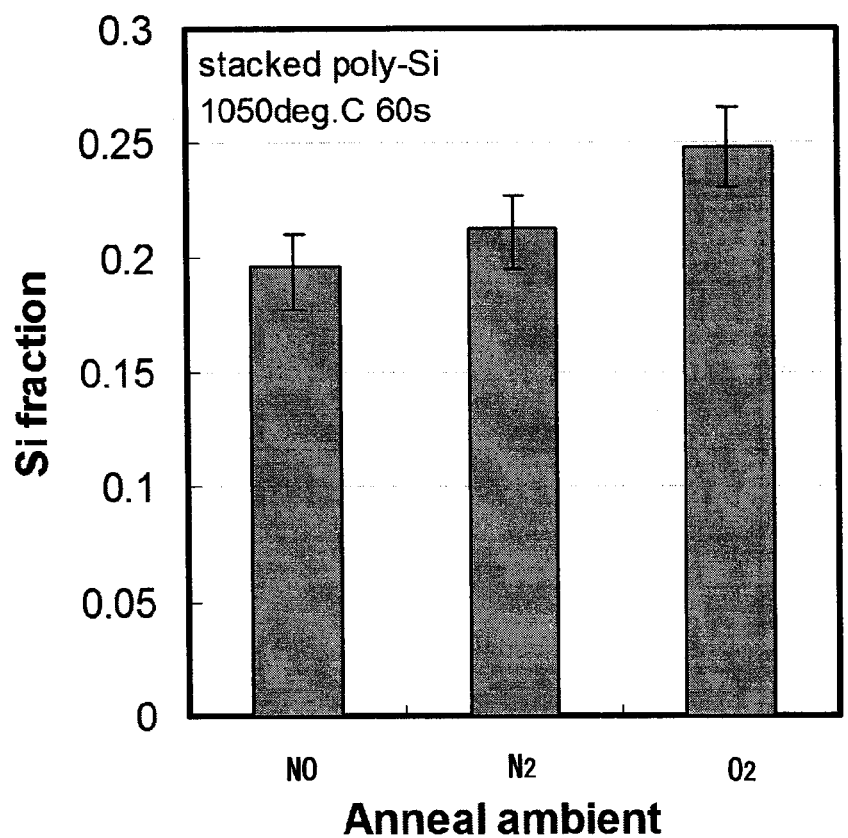
FIG. 4 is a graph showing differences in grain size of polysilicon films in an annealing atmosphere.

FIG. 4 is a graph showing a comparison of grain sizes when laminated polysilicon films are annealed by changing the annealing atmosphere to NO, $N_2$, and $O_2$. In FIG. 4, the longitudinal axis represents a silicon ratio that is measured by ellipsometry measurement and is used as an index for the grain size. There is a positive correlation between the silicon ratio and the grain size. Annealing is performed under the conditions of 1050° C. and 60 seconds.

Figure 5:
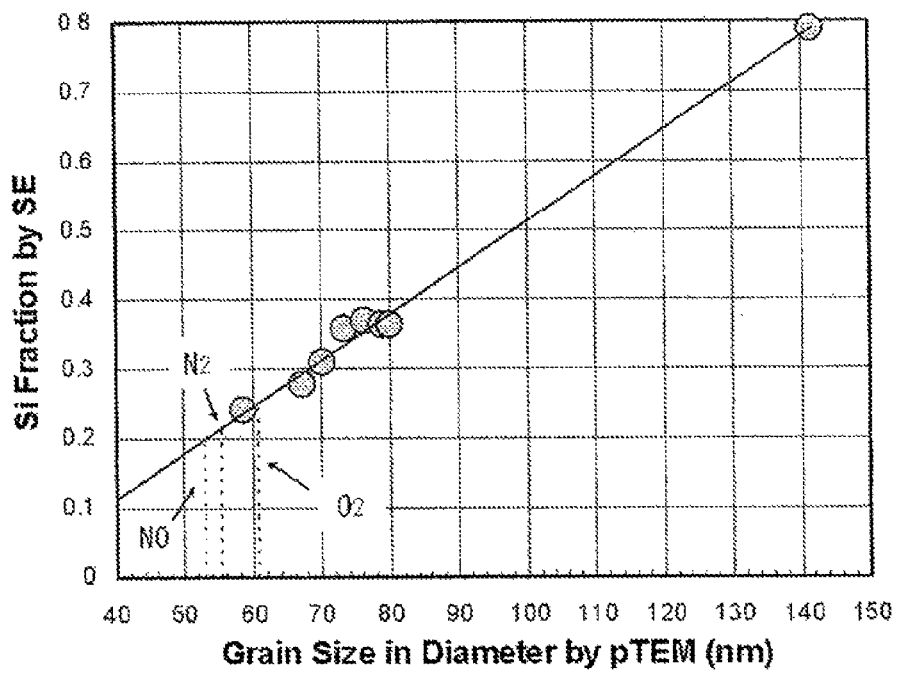
FIG. 5 is a graph showing a correlation between a grain size and a silicon ratio.
Figure 6:
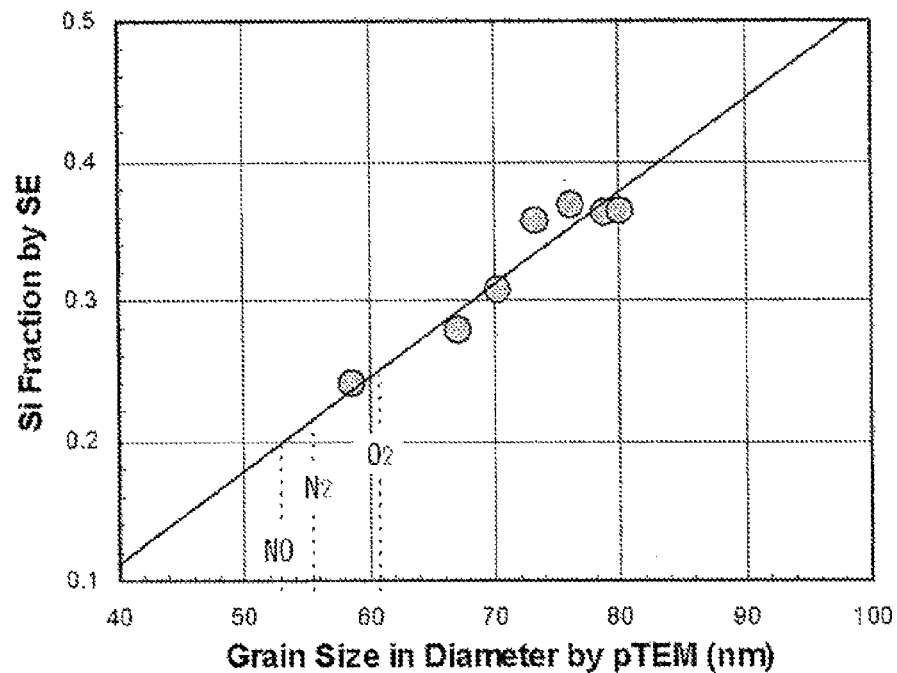
FIG. 6 is an enlarged graph of FIG. 5.

FIG. 5 is a graph showing a correlation between a silicon ratio and a grain size obtained by TEG (Test Element Group). FIG. 6 is an enlarged graph of FIG. 5. In FIGS. 5 and 6, the horizontal axis represents the grain size of polysilicon, and the longitudinal axis represents the silicon ratio. As shown in FIGS. 5 and 6, there is a positive correlation between the silicon ratio and the grain size. Accordingly, the grain size of polysilicon in each annealing can be obtained based on the graph shown in FIG. 5.

As shown in FIG. 4, when annealing is performed in an NO gas atmosphere, the grain size is smaller than that when annealing is performed in an $N_2$ gas atmosphere and that when annealing is performed in an $O_2$ gas atmosphere. When annealing is performed in the $N_2$ gas atmosphere, the grain size is smaller than that when annealing is performed in the $O_2$ gas atmosphere. For example, when annealing is performed in the NO gas atmosphere, the grain size of polysilicon is 53 nm. When annealing is performed in the $N_2$ gas atmosphere, the grain size of polysilicon is 55 nm. When annealing is performed in the $O_2$ gas atmosphere, the grain size of polysilicon is 61 nm. In this manner, annealing in a gas containing nitrogen enables reduction of the grain size as compared with annealing in an oxygen gas atmosphere.

Figure 7:
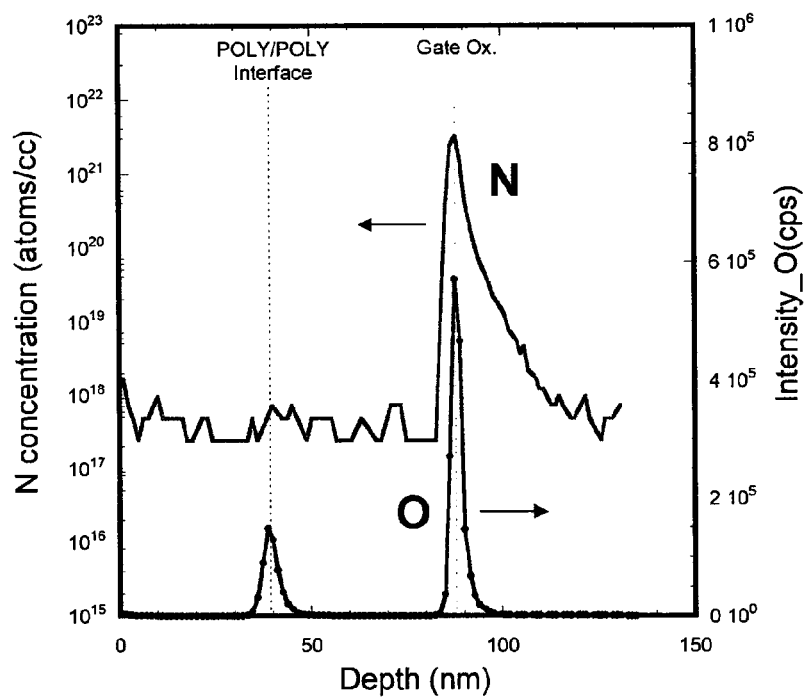
FIG. 7 is a graph showing an SIMS profile of a polysilicon film obtained immediately after deposition.
Figure 8:
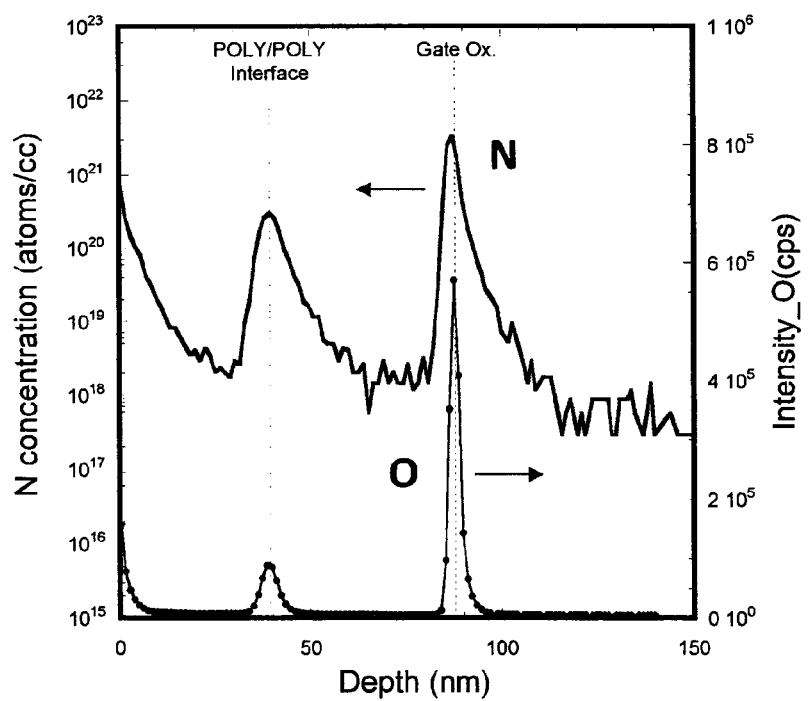
FIG. 8 is a graph showing an SIMS profile of a polysilicon film obtained after annealing.

FIGS. 7 and 8 show the results of an SIMS (Secondary Ion Mass Spectrometry) analysis conducted on a sample, which was annealed in an NO gas atmosphere, in order to examine the reason why the above-mentioned gain sizes are obtained. FIG. 7 is a profile in films of oxygen and nitrogen immediately after formation of laminated polysilicon films. FIG. 8 shows a profile in films of oxygen and nitrogen after annealing in the NO atmosphere.

It is seen from FIG. 7 that, before annealing, an oxygen peak is observed in the interlayer between the polysilicon layers and in the gate insulating film 13, respectively. Nitrogen exists only in the gate insulating film. This nitrogen is introduced by plasma nitriding during formation of the gate insulating film 13. When annealing is performed in the NO atmosphere, as shown in FIG. 8, another clear nitrogen peak is observed in the interlayer between the polysilicon layers. Specifically, nitrogen is introduced into the interlayer oxide layer 22 between the first polysilicon film 21 and the second polysilicon film 23 by annealing in the gas atmosphere containing nitrogen. In this case, there is little change in the height of the nitrogen peak in the gate insulating film 13. This indicates that the nitrogen contained in the interlayer is obtained, with the result that the NO gas is diffused into the polysilicon layers and piles up.

The oxygen concentration in the interlayer oxide layer 22 is preferably $2 \times 10^{21}$ atoms/cm$^3$ or more, and more preferably, 2 to $3 \times 10^{21}$ atoms/cm$^3$ or more. The nitrogen concentration in the interlayer oxide layer 22 is preferably $3 \times 10^{20}$ atoms/cm$^3$ or more. In the interlayer oxide layer 22, the nitrogen concentration is preferably equal to or more than 1/10 of the oxygen concentration. In the interlayer oxide layer 22, the nitrogen concentration may be set to be lower than the oxygen concentration.

Figure 9:
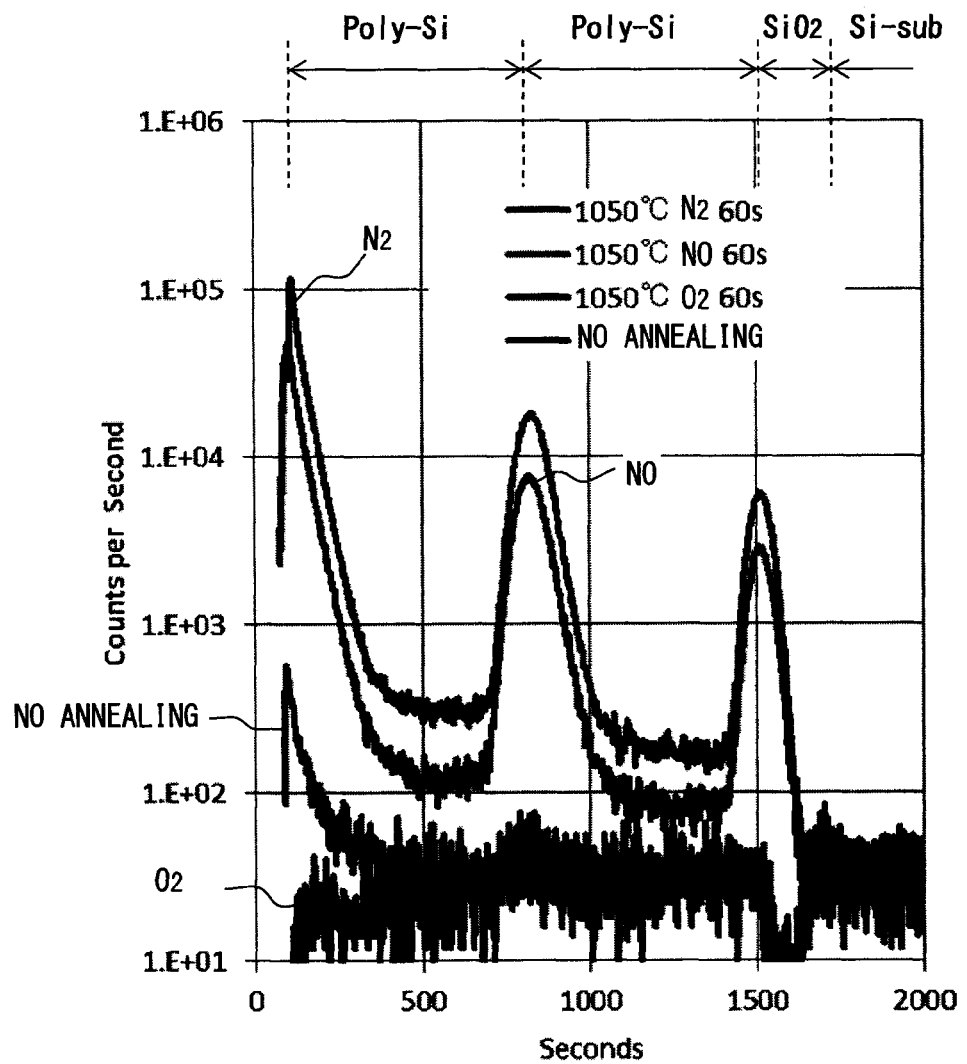
FIG. 9 is a graph showing differences in nitrogen profile depending on the annealing atmosphere.

FIG. 9 shows differences in nitrogen profile depending on the annealing atmosphere. The horizontal axis represents a time corresponding to a depth, and the longitudinal axis represents the number of counts corresponding to a density. FIG. 9 shows a nitrogen profile of a sample annealed in an NO atmosphere, a nitrogen profile of a sample annealed in an $N_2$ atmosphere, a nitrogen profile of a sample annealed in an $O_2$ atmosphere, and a nitrogen profile of a sample without annealing. Annealing is performed under the conditions of 1050° C. and 60 seconds. In the annealing in the $O_2$ gas atmosphere, no nitrogen is introduced into the polysilicon films. On the other hand, when the annealing process is performed in a gas atmosphere containing nitrogen, such as an $N_2$ gas or an NO gas, a nitrogen peak is observed in the interlayer between the first polysilicon film 21 and the second polysilicon film 23.

It is considered that the nitrogen contained in the interlayer between the first polysilicon film 21 and the second polysilicon film 23 causes a difference in grain growth between the first polysilicon film 21 and the interlayer oxide layer 22. The grain growth of polysilicon is a phenomenon in which a part of the grain grows and a part of the grain disappears due to transfer of silicon atoms at a grain boundary during annealing. It is surmised that nitrogen has an effect of preventing transfer of silicon atoms.

As illustrated in the first embodiment, annealing is performed in a gas atmosphere containing nitrogen, after formation of the uppermost polysilicon film of the laminated polysilicon films. The annealing temperature in step S3 is set to be higher than the film formation temperature of the polysilicon film. This enables introduction of nitrogen into the interlayer oxide layer 22, and suppresses the grain growth. Further, in step 3, annealing is performed at a pressure of about an atmospheric pressure, or at a pressure equal to or higher than the atmospheric pressure. Examples of the pressure of about the atmospheric pressure include fine decompression conditions from 600 Torr to the atmospheric pressure. The lower limit of the pressure during annealing is not limited to 600 Torr. This makes it possible to introduce nitrogen into the interlayer oxide layer 22 and suppress the grain growth. Furthermore, the formation of each electrode using the laminated polysilicon films including the first polysilicon film 21, the interlayer oxide layer 22, and the second polysilicon film 23 suppresses manufacturing variations. This leads to an improvement in productivity. The use of the laminated polysilicon films as the gate 20 of the MOS enables improvement of the performance of the transistor 100.

In the case of annealing using an NO gas or an $N_2O$ gas, even when a surface oxide film is formed on the surface of the second polysilicon film 23, nitrogen oxide passes through the surface oxide film and reaches the interlayer oxide layer 22. This suppresses the grain grow even when annealing is performed after formation of the surface oxide film on the surface of the second polysilicon film 23. Further, in step S3, annealing in a gas atmosphere containing no oxygen suppresses the grain growth.

An annealing step in which the temperature is first set to be higher than the film formation temperature after the formation of the second polysilicon film 23 is referred to as an annealing step in step S3. Specifically, after the formation of the second polysilicon film 23, when the substrate temperature becomes higher than the film formation temperature of the second polysilicon film 23 for the first time, a gas atmosphere containing nitrogen is used. For example, an annealing step performed prior to the annealing step for diffusing the impurity implanted in the gate 20 is performed in a gas atmosphere containing nitrogen. This allows nitrogen to be introduced into the laminated polysilicon films simultaneously with the grain growth. Consequently, the interlayer oxide layer 22 contains nitrogen, which suppresses the grain growth.

After the formation of the second polysilicon film 23, which is the uppermost layer, a gas containing nitrogen is supplied in the step in which a maximum temperature is obtained. Specifically, a gas atmosphere containing nitrogen is used in the annealing step, in which the maximum temperature is obtained, after the formation of the second polysilicon film 23. During the period from the formation of the second polysilicon film 23 for diffusing the dopant until the formation of the source and drain, the step in which the maximum temperature is obtained corresponds to the annealing step in step S3. Accordingly, the annealing temperature in step S5 is lower than the annealing temperature in step S3. This allows nitrogen to be introduced into the laminated polysilicon films simultaneously with the grain growth. Consequently, the interlayer oxide layer 22 contains nitrogen, which suppresses the grain growth. Further, after the formation of the second polysilicon film 23, the first annealing step and the annealing step at the maximum temperature are preferably performed in a gas atmosphere containing nitrogen. The annealing in the gas atmosphere containing nitrogen is performed prior to the formation of the interlayer insulating film formed on the gate 20.

The interlayer oxide layer 22 contains about the same amount of nitrogen atoms as that of oxygen atoms. For example, the interlayer oxide layer 22 contains nitrogen atoms that are $\frac{1}{10}$ or more of the number of oxygen atoms. This suppresses the grain growth.

Second Embodiment

Figure 10:
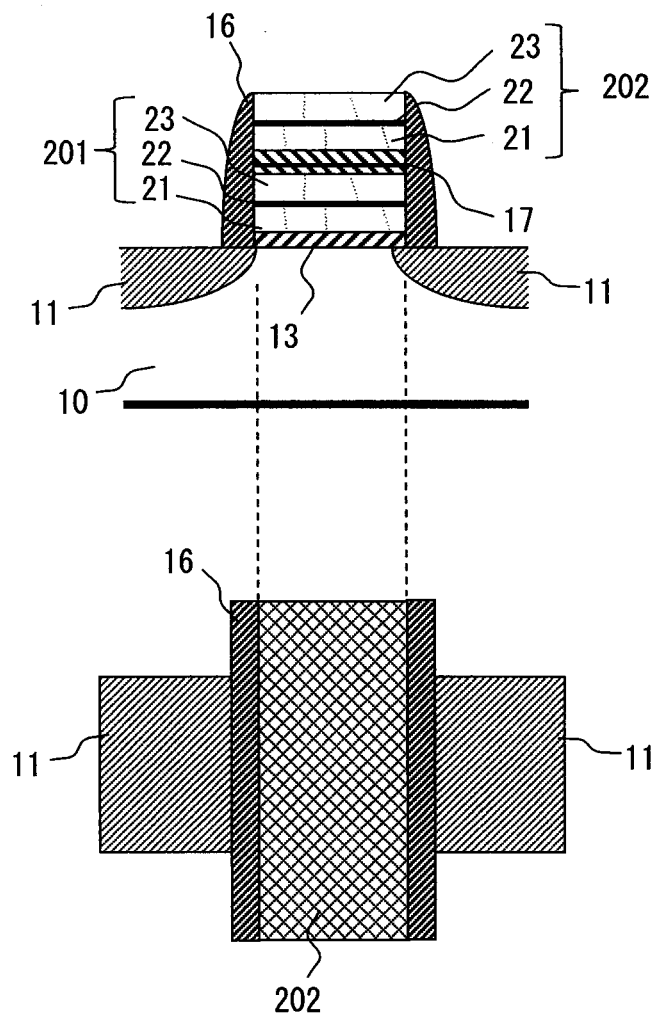
FIG. 10 is a schematic diagram showing a transistor configuration of a floating gate type memory.

A semiconductor device according to a second embodiment will be described with reference to FIG. 10. The upper side of FIG. 10 shows a sectional view of the transistor 100, and the lower side of FIG. 10 shows a plan view of the transistor 100. The semiconductor device according to the second embodiment is a floating gate type non-volatile memory. The basic configuration of the semiconductor device is similar to that of the first embodiment, so the description thereof is omitted.

In the second embodiment, the transistor 100 is a floating gate type transistor and includes a control gate 202 and a floating gate 201. The floating gate 201 is disposed on the gate insulating film 13. Further, the control gate 202 is disposed above the floating gate 201 through an inter-electrode insulating film 17. In other words, the floating gate 201 and the control gate 202 are laminated. The inter-electrode insulating film 17 is interposed between the floating gate 201 and the control gate 202.

In this case, the respective electrodes of the floating gate 201 and the control gate 202 are formed of laminated polysilicon films. Accordingly, the floating gate 201 and the control gate 202 each include the first polysilicon film 21, the interlayer oxide layer 22, and the second polysilicon film 23. The method of manufacturing the laminated polysilicon films including the first polysilicon film 21, the interlayer oxide layer 22, and the second polysilicon film 23 is similar to that of the first embodiment. Specifically, immediately after the formation of the second polysilicon film 23 of the floating gate 201, annealing is performed in a gas atmosphere containing nitrogen. Further, immediately after the formation of the second polysilicon film 23 of the control gate 202, annealing is performed in a gas atmosphere containing nitrogen.

This configuration suppresses the grain growth in the same manner as in the first embodiment. Consequently, the performance of the transistor 100 can be improved and a high-performance memory can be realized. In the above description, the respective electrodes of the control gate 202 and the floating gate 201 are formed of the laminated polysilicon films including the first polysilicon film 21, the interlayer oxide layer 22, and the second polysilicon film 23. However, only one of the control gate 202 and the floating gate 201 may be formed of the laminated polysilicon films.

Third Embodiment

Figure 11:
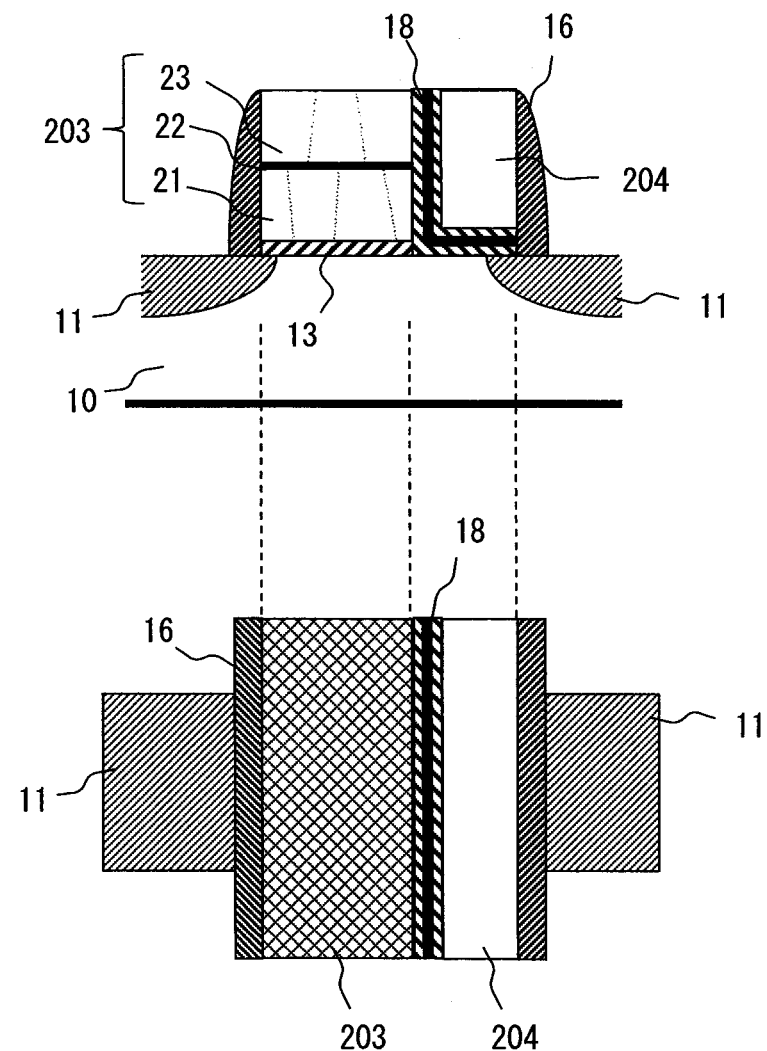
FIG. 11 is a schematic diagram showing a transistor configuration of a split gate capture type memory.

A semiconductor device according to a third embodiment will be described with reference to FIG. 11. The upper side of FIG. 11 shows a sectional view of the semiconductor device, and the lower side of FIG. 11 shows a plan view of the semiconductor device. The semiconductor device according to the third embodiment is a split gate type non-volatile memory. The basic configuration of the semiconductor device is similar to that of the first embodiment, so the description thereof is omitted.

In the third embodiment, the transistor 100 is a split gate type transistor and includes a control gate 203 and a memory gate 204. An insulating film 18 is interposed between the control gate 203 and the memory gate 204. The control gate 203 is formed of laminated polysilicon films. As described above, the control gate 203 of the transistor 100 is formed of the laminated polysilicon films including the first polysilicon film 21, the interlayer oxide layer 22, and the second polysilicon film 23. This configuration suppresses the grain growth as in the first embodiment. Consequently, the performance of the transistor 100 can be improved.

The laminated polysilicon films according to the third embodiment are not limited to the gate 20 of the transistor 100, and may also be used for other electrodes.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A method of manufacturing a semiconductor device, comprising:
    forming a first polysilicon film on a substrate;
    forming an oxide layer on a surface of the first polysilicon film;
    forming a second polysilicon film above the first polysilicon film, the second polysilicon film being in contact with the oxide layer; and
    performing annealing at a temperature higher than a film formation temperature of the first and second polysilicon films in a gas atmosphere containing at least one of $N_2$, NO or $N_2O$, after the formation of the second polysilicon film, such that nitrogen is introduced to the oxide layer to suppress grain growth inside the polysilicon films.

2. The method of manufacturing a semiconductor device according to claim 1, wherein the annealing in the gas atmosphere containing nitrogen is performed at a pressure equal to or higher than an atmospheric pressure.

3. The method of manufacturing a semiconductor device according to claim 1, wherein the annealing in the gas atmosphere containing at least one of $N_2$, NO or $N_2O$ is performed in a first annealing step after the formation of the second polysilicon film.

4. The method of manufacturing a semiconductor device according to claim 1, wherein the step of annealing in the gas atmosphere containing at least one of $N_2$, NO or $N_2O$ is a step to be performed at a maximum temperature after formation of the second polysilicon film.

5. The method of manufacturing a semiconductor device according to claim 1, wherein
    after the annealing in the gas atmosphere containing at least one of $N_2$, NO or $N_2O$, an impurity is introduced into the second polysilicon film, and
    the second polysilicon film in which the impurity is introduced is annealed.

6. The method of manufacturing a semiconductor device according to claim 5, wherein
    the annealing of the second polysilicon film in which the impurity is introduced is performed at a temperature lower than the temperature at which the annealing in the gas atmosphere containing at least one of $N_2$, NO or $N_2O$ is performed.

7. The method of manufacturing a semiconductor device according to claim 1, wherein
    the first polysilicon film is formed on a gate insulating film, and
    laminated polysilicon films including the first polysilicon film and the second polysilicon film serve as a gate of a transistor.

8. The method of manufacturing a semiconductor device according to claim 7, wherein
    the semiconductor device is a floating gate type transistor, and
    at least one of a control gate and a floating gate of the floating gate type transistor comprises the laminated polysilicon films.

9. The method of manufacturing a semiconductor device according to claim 7, wherein
    the semiconductor device is a split gate type transistor, and
    a control gate of the split gate type transistor comprises the laminated polysilicon films.

10. A method of manufacturing a semiconductor device, comprising:
    forming a first polysilicon film on a substrate;
    forming an oxide layer on a surface of the first polysilicon film;
    forming a second polysilicon film above the first polysilicon film, the second polysilicon film being in contact with the oxide layer; and
    annealing the first and second polysilicon films in a gas atmosphere containing nitrogen at a pressure equal to or higher than an atmospheric pressure, after the formation of the second polysilicon film, wherein
    after the annealing in the gas atmosphere containing nitrogen, an impurity is introduced into the second polysilicon film, and
    the second polysilicon film in which the impurity is introduced is annealed.

11. The method of manufacturing a semiconductor device according to claim 10, wherein the annealing in the gas atmosphere containing nitrogen is performed in a first annealing step after the formation of the second polysilicon film.

12. The method of manufacturing a semiconductor device according to claim 10, wherein the annealing in the gas atmosphere containing nitrogen is performed at a temperature higher than a film formation temperature of the second polysilicon film.

13. The method of manufacturing a semiconductor device according to claim 10, wherein the annealing of the second polysilicon film in which the impurity is introduced is performed at a temperature lower than the temperature at which the annealing in the gas atmosphere containing nitrogen is performed.

14. The method of manufacturing a semiconductor device according to claim 10, wherein the gas containing nitrogen includes one of an $N_2$ gas, an NO gas, and an $N_2O$ gas.

15. The method of manufacturing a semiconductor device according to claim 10, wherein
    the first polysilicon film is formed on a gate insulating film, and
    laminated polysilicon films including the first polysilicon film and the second polysilicon film serve as a gate of a transistor.

16. The method of manufacturing a semiconductor device according to claim 15, wherein
    the semiconductor device is a floating gate type transistor, and
    at least one of a control gate and a floating gate of the floating gate type transistor comprises the laminated polysilicon films.

17. The method of manufacturing a semiconductor according to claim 15, wherein
the semiconductor device is a split gate type transistor, and a control gate of the split gate type transistor comprises the laminated polysilicon films.

18. The method of manufacturing a semiconductor device according to claim 1, wherein the annealing is performed for 60 seconds.

\* \* \* \* \*